(12) United States Patent
Jennison et al.

(10) Patent No.: US 6,790,476 B1
(45) Date of Patent: Sep. 14, 2004

(54) METHOD OF ADHESION BETWEEN AN OXIDE LAYER AND A METAL LAYER

(75) Inventors: Dwight R. Jennison, Albuquerque, NM (US); Alexander Bogicevic, Canton, MI (US); Jeffry A. Kelber, Plano, TX (US); Scott A. Chambers, Kennewick, WA (US)

(73) Assignee: Sandia Corporation, Albuquerque, NM (US)

( * ) Notice: Subject to any disclaimer, the term of this patent is extended or adjusted under 35 U.S.C. 154(b) by 294 days.

(21) Appl. No.: 10/154,224

(22) Filed: May 21, 2002

Related U.S. Application Data (63) Continuation-in-part of application No. 09/576,919, filed on May 23, 2000, now abandoned.

(51) Int. Cl.[7] .............................................. C23C 16/06
(52) U.S. Cl. .................... 427/255.7; 427/250; 427/534; 204/192.1
(58) Field of Search .............................. 427/255.7, 250, 427/534; 204/192.1

(56) References Cited

U.S. PATENT DOCUMENTS

| | | | |
|---|---|---|---|
| 4,701,352 A | | 10/1987 | DeLuca et al. |
| 4,962,073 A | * | 10/1990 | Martin et al. .................. 502/4 |
| 5,480,730 A | | 1/1996 | Swisher |
| 5,965,629 A | | 10/1999 | Jung et al. |
| 5,989,768 A | | 11/1999 | Little |
| 5,997,958 A | | 12/1999 | Sato et al. |
| 6,037,019 A | | 3/2000 | Kooyer et al. |
| 6,331,329 B1 | * | 12/2001 | McCarthy et al. .......... 427/387 |
| 6,518,168 B1 | * | 2/2003 | Clem et al. .................. 438/623 |

OTHER PUBLICATIONS

Bogicevic, A. and Jennison, D.R., "Variations in the Nature of Metal Adsorption on Ultrathin $Al_2O_3$ Films," Sandia National Laboratories, May 1999, 1–4.

Bogicevic, A. and Jennison, D.R., "Role of surface vacancies and water products in metal nucleation: Pt/MgO(100)," Sandia National Laboratories, May 1999, 1–4.

Niu, C., Shepherd, K., Martini, D., Kelber, J.A., Jennison, D. R., and Bogicevic, A., "Cu Interactions with $\alpha$– $Al_2O_3$ (0001): Effects on Surface Hydroxyl Groups vs. Dehydroxylation by Ar Ion Sputtering," 1–14, no date available.

Kelber, J. A., et al., "Copper wetting of $\alpha$– $Al_2O_3$ (0001): theory and experiment," Surface Science 446, 2000, 76–88.

* cited by examiner

*Primary Examiner*—Bret Chen
(74) *Attorney, Agent, or Firm*—Elmer A. Klavetter (57) ABSTRACT

A method of controlling the wetting characteristics and increasing the adhesion between a metal and an oxide layer. By introducing a negatively-charged species to the surface of an oxide layer, layer-by-layer growth of metal deposited onto the oxide surface is promoted, increasing the adhesion strength of the metal-oxide interface. The negatively-charged species can either be deposited onto the oxide surface or a compound can be deposited that dissociates on, or reacts with, the surface to form the negatively-charged species. The deposited metal adatoms can thereby bond laterally to the negatively-charged species as well as vertically to the oxide surface as well as react with the negatively charged species, be oxidized, and incorporated on or into the surface of the oxide.

31 Claims, 7 Drawing Sheets

METHOD OF ADHESION BETWEEN AN OXIDE LAYER AND A METAL LAYER

This application is a continuation-in-part of U.S. patent application Ser. No. 09/576,919, filed on May 23, 2000, now abandoned.

This invention was made with Government support under Contract No. DE-AC04-94AL85000 awarded by the Department of Energy. The Government has certain rights in the invention.

BACKGROUND OF THE INVENTION

The invention describes a method for engineering interfaces between metals and the oxides of metals, and more particularly to a process to increase the strength and stability of an oxide-metal interface.

Metals deposited on an oxide surface generally do not wet the surface because the metal-to-oxide interaction is relatively weak. At room temperature, metal islands form on an oxide surface and grow until they merge into a metal overlayer. The morphology of the resulting metal layer is thus quite variable within several nanometers (nm) of the oxide surface, and the resulting interface is also quite non-uniform and weak. To strengthen the interface, reactive metals are sometimes added, such as brazing compounds. However, it is sometimes undesirable for such metals to be added because they often react with the oxide to form an intermediate layer which is poorly defined and contrary to the desired structure, such as within a microelectronics device.

One example of an application incorporating metal-to-oxide interactions includes prototypes being tested for the next generation of computer memory, magnetic random access memory (MRAM), which contain junction tunneling devices. For example, aluminum can be deposited on a magnetic layer, such as cobalt doped with iron. Subsequent oxidation produces an ultrathin (0.5 nm to less than 2 nm) layer of aluminum oxide. Another magnetic layer must then be deposited on the oxide. It is essential for MRAM applications that this interface be uniform, reproducible, and stable. However, the cobalt-oxide interaction is sufficiently weak to prevent wetting and the weak interfaces which result can be a cause of failure, that is, that the cobalt no longer adequately adheres to the oxide surface. In addition, because the metal grows in a three dimensional fashion on the oxide with islands nucleated at defects such as steps and impurities, there can be a large stochastic variability in structure and consequently a poor magnetization and uniformity in the tunneling resistance produced by the oxide film.

Another area where engineered interfaces can be important is heterogeneous catalysis. Metal particles are produced on a support material, commonly alumina. The dispersion (size) and shapes of the metal particles are important to the rate of the desired chemical reaction. In turn, the shape of the particles depends on the interfacial energy between the metal and the oxide, and can in principle vary from flat two dimensional islands (if strong interactions are present) to three dimensional amorphous or faceted objects having minimal contact to the oxide (if the interaction is very weak). The ability to control this shape by interfacial engineering of the adhesion energy would provide an additional tool for catalyst design.

The sealing of metals to ceramics is yet another application in which adhesion properties are important. In some applications, the use of added reactive metals is undesirable and producing good seals without them requires another method to achieve wetting and interface strength.

Needed is an alternate technique of interfacial engineering that can cause a metal to wet and which allows control or increase of oxide-metal adhesion.

DESCRIPTION OF SPECIFIC EMBODIMENTS

Figure 1:
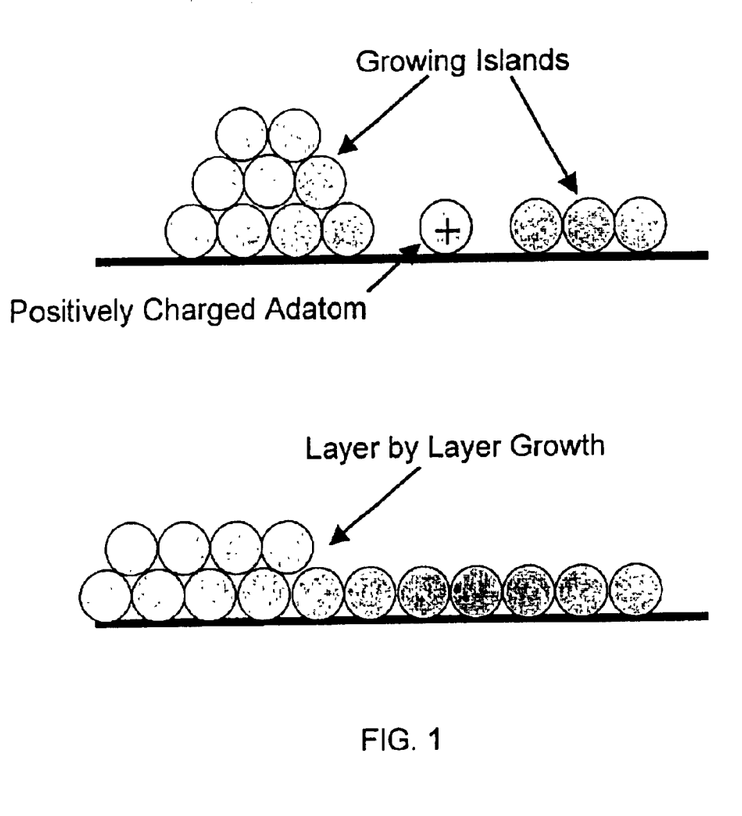
FIG. 1 shows schematically the three dimensional island vs. the layer by layer growth modes of metals on a metal oxide surface.

On many oxide surfaces, especially highly ionic oxides such as alumina, isolated metal atoms (adatoms) are oxidized (that is, become positively charged) by the clean oxide surface itself. The strength of the binding of the adatoms to the surface is determined largely by the degree of oxidation and by the resulting ionic radii. Increased binding can produce a mechanism of growth known as a layer-by-layer mode rather than a mode where islands grow and coalesce (the typical growth mode). FIG. 1 illustrates different growth modes. When the binding of isolated metal atoms is compared with those in two- or three-dimensional islands, the energetically-favored structure that will be obtained upon metal deposition from a vapor can be determined. For example, whether it is energetically favorable for deposited metal to spread out over the surface, leading to "wetting" and layer-by-layer metal growth with continued deposition, or to clump in three dimensional islands (as illustrated in FIG. 1) can be investigated theoretically by a computation known as a Born-Haber cycle, if the energetics of the possible structures are known. In the island case, the positions and sizes of the islands are strongly influenced by defects on the surface, such as steps, thus causing a large random factor in the detailed structure. If the binding energy of isolated adsorbed metal atoms (metal adatoms) could be increased sufficiently, the effects of the Born-Haber prediction could be reversed and wetting and layer-by-layer growth would occur, at least for the first few layers.

It is sometimes also possible to make useful structures that are metastable in that they are not energetically the globally preferred structures. For example, the binding of isolated metal adatoms is also related to the energy required to make them mobile on the surface. This sets a temperature for facile diffusion across the surface. If this diffusion occurs at a given temperature, the metal adatoms move until they join a growing metal island and, if energetically favored, wetting does not occur and the metal does not grow in a layer-by-layer fashion. However, if the strength of the adatom binding could be increased to the point at which the adatom is pinned and cannot move at the manufacturing temperature, then the deposited metal will be spread out over the surface and, though only metastable, wetting will occur, again producing a more uniformly layered surface (illustrated in FIG. 2).

Figure 2:
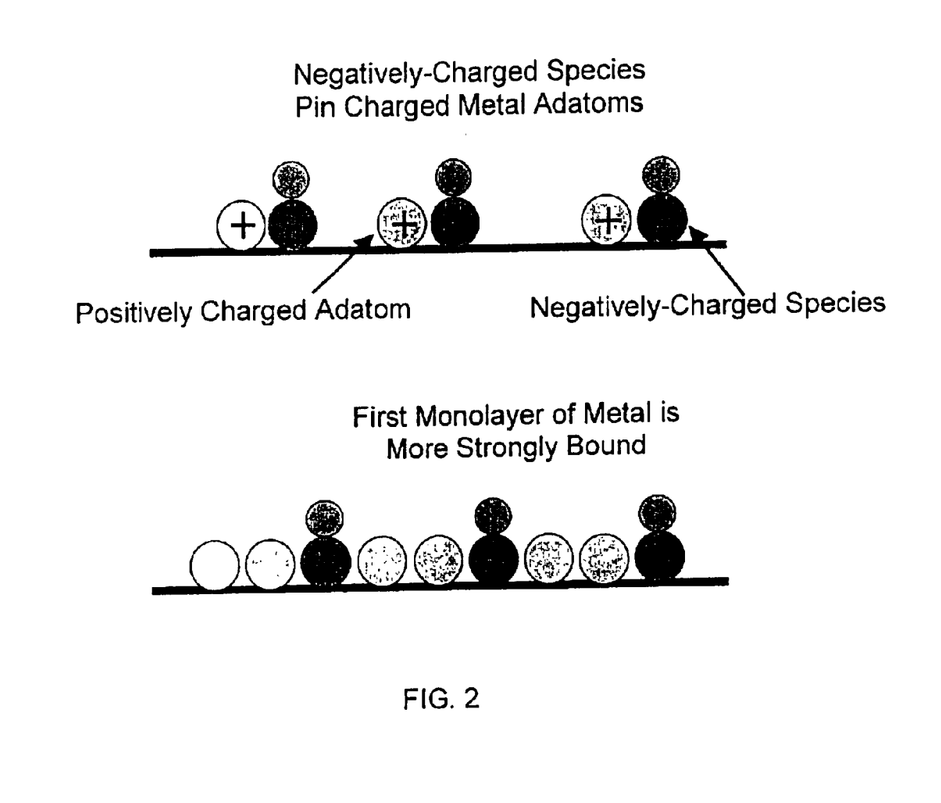
FIG. 2 shows the addition of an adsorbed negatively charged species (adsorbed OH at about ⅓ monolayer (ML)).

In the method of the present invention, the wetting characteristics of a surface can be controlled by introducing negatively-charged species to the surface, thereby allowing a metal to wet the surface in a controlled and uniform manner in a growth mode that promotes layered surfaces. Introduction of a negatively-charged species to the surface can be accomplished by either depositing a negatively-charged species onto the oxide surface or by depositing a compound onto the surface that can dissociate or otherwise react to form a negatively-charged species. The adhesion or binding of the metal atoms to the surface is increased because the deposited metal ions can bond laterally to the negatively-charged species as well as vertically to the oxide surface in a layer-by-layer metal growth mode (FIG. 2).

Interestingly, the adhesion mechanism changes with the fraction of coverage of the negatively-charged species on the surface of the metal oxide. With less than approximately ½ ML coverage of the negatively-charged species, the primary mechanism appears to be that the adjacent metal adatoms experience electrostatic interactions both vertically with the underlying $O^{2-}$ ions and laterally to the introduced negatively charged species, resulting in a deposited layer of greater uniformity and greater adhesion. However, when the surface is essentially fully covered, such as an essentially fully hydroxylated surface, certain metals produce a chemical reaction that leads to laminar growth of the metal film, where the metal cations are incorporated into the top layer of the metal oxide and the metal cations bind ionically to the substrate as well as bound to neighboring metal ion, resulting in stronger interfacial binding (i.e., adhesion).

One useful negatively-charged species is an adsorbed isolated hydroxyl group. These hydroxyl groups can be added to a clean and largely defect free oxide surface by means such as exposure of the surface to water (if the oxide readily dissociates water), to a water plasma, to a mixture of oxygen and water gas, to an oxygen plasma in the presence of a background of hydrogen gas, or to hydroxide-containing chemicals which readily dissociate on the surface leaving a hydroxyl group behind (such as specially made chemicals as XeOH).

Another useful negatively-charged species is an adsorbed isolated oxygen atom. These can be added to the surface by exposure to and slow cooling in an oxygen plasma, by exposure to chemicals which dissociate on the surface leaving an oxygen atom behind, such as ozone or, in the presence of ultraviolet light, nitrous oxide ($N_2O$). Other useful negatively-charged species are halogens such as fluorine, chlorine, bromine, and iodine, deposited, for example, by XeF or other like compounds.

In one embodiment, the negatively charged species is at a coverage of less than approximately one-half monolayer; theoretical calculations have indicated that a cover of one-third monolayer is optimal for hydroxyl ions. To achieve approximately one-third monolayer coverage, a surface is first exposed to humid air sufficient to achieve essentially one monolayer coverage and then the surface is heated to approximately 1200K to reduce the hydroxyl coverage to approximately one-third monolayer. Essentially any metal adatom can be deposited on an oxide surface for this embodiment. The requirement is that the atom be a positively charged adatom that can form in layer-by-layer growth. Metal adatoms in Groups IB, IIB, IIIA, IIIB, IVA, IVB, VA, VB, VIB, VIIB, and VIII of the Periodic Table of Elements all satisfy these criteria. In particular, the metal adatoms lithium, cobalt, potassium, yttrium, niobium, ruthenium, palladium, platinum, copper, silver, gold and aluminum have been investigated theoretically using the Born-Haber cycle calculations and have been shown to wet under the method of the present invention and to have increased adhesion. Copper (one of these adatoms) deposition on a ceramic surface, such as an alumina surface, is of particular interest because of its use in microelectronics; experimental evidence has validated the theoretical calculations that show the increased adhesion of copper to the oxide layer through the addition of a negatively-charged species according to the method of the present invention. Another metal adatom of interest is cobalt, as cobalt is being used in magnetic junction tunneling devices.

These metal adatoms can be deposited in this embodiment to promote layer-by-layer metal growth on any oxide surface. One surface of interest includes aluminum oxide, as films of this material are easily produced on metals such as cobalt by Al metal deposition and oxidation at moderate temperatures. Aluminum oxide is also an important support material for heterogeneous catalysts and is an important structural ceramic. Another oxide surface of interest includes silicon dioxide ($SiO_2$) surfaces. Both metal oxide surfaces and non-metal oxide surfaces, such as silica oxide surfaces, present oxygen sites to which the positively-charged adatoms can bind and positively charged sites, such as from the aluminum and silicon ions, to which the added negatively-charged species can bind to promote the layer-by-layer growth mechanism. Thus, the methods described herein can apply to all of the numerous metal/oxide junctions.

The isolated adatoms are positively charged because of oxidation. If the oxide surface is prepared to also have negatively charged adspecies upon it, these species attract metal adatoms and Increase their binding (see FIG. 2), often by a factor of 2–3 or more, thus pinning them and causing wetting. Thus, the method of the present invention changes the wetting characteristics of the metal adatoms and increases the binding or adhesion characteristics of the metal adatom-oxide interface.

At the correct concentrations, these negatively charged species can dramatically increase the binding strength of the resulting metal overlayer, thus adding both stability and smoothness to the interfacial properties. The specific identity of the negatively charged species will affect the strength of the effect and other characteristics, such as whether products will be evolved by dissociation of the species in the presence of the metal overlayer. Because the negatively charged species repel each other, saturation coverage of the species excludes them from being on adjacent surface sites (FIG. 2). For example, on a basal (dose packed) oxide surface, saturation typically occurs at one species for every three surface oxygen ions, thus leaving room for metal atoms to be deposited between them as illustrated in FIG. 2. If a negatively-charged species is present on the surface, the adjacent metal adatoms experience electrostatic interactions both vertically with the underlying $O^{2-}$ ions and laterally to the introduced negatively charged species, resulting in a deposited layer of greater uniformity and greater adhesion.

In one embodiment, the surface is cleaned to remove impurities. This may be done, for example, by sputtering removal using an ion beam, by burning off impurities by using an oxygen plasma or an ozone source, by annealing at high temperature in an oxygen ambient atmosphere, or by sonicating in a solvent.

The quality of the surface with respect to defects in the crystal structure or non-stoichiometries in the oxide composition can also be improved. This may be done, for example, by annealing at high temperature in an oxygen environment. This step can be combined with the cleaning step.

The negatively-charged species are then introduced to the surface. This can be accomplished, for example, by exposure of the surface to atoms or molecules, or to mixtures of atoms/molecules, at appropriate temperatures and pressures, so as to cause attachment to, or in the case of molecules spontaneous dissociation on, the surface, so as to produce and stabilize negatively-charged fragments on the surface, or to react with the surface to convert the surface into a surface with negatively-charged species on the surface, and so that negatively charged fragments remain after treatment. This introduction of negatively-charged species to a surface can be accomplished by gases reacting with the surface, which converts the surface into one with negatively-charged species on top of a close packed plane; by stimulating the dissociation of molecules on the surface using photon (for example, ultraviolet) or electron beams; or by exposure of the surface to a plasma which leaves such species on the surface at processing temperatures. The negatively-charged species can be introduced at room temperature or at elevated temperatures. The metal is then deposited on the surface, wetting the surface in a controlled manner. In one embodiment, the first metal layer could be introduced simultaneously with the negatively-charged species, wetting the surface in a controlled manner. An additional step of annealing the surface can be performed to provide additional stability to the interface system, as metastable interfaces have been observed to form with mixed neutral and positively charged metal atoms.

In one embodiment using hydroxyl ions as the negatively charged species introduced to the surface, when the surface cover of the hydroxyl Ions is essentially complete (with essentially complete being greater than approximately 0.5 ML coverage), a chemical reaction results from deposition of certain metals that results in the metal cations binding strongly to both the substrate and neighboring metallic atoms. These ionic adhesion sites produce not only a stronger interface but also change the morphology of the film. Instead of forming weakly bound three-dimensional islands, laminar growth in achieved. Surface diffraction analyses reveals crystalline metal growth by only a few atomic layers, resulting in a complete covering of the oxide surface in spite of a substantial lattice mismatch. However, only certain metals appear to function with this essentially fully hydroxylated surface. These metals include Cr, Co, Ni, Mo, Ru, Cu and Rh. This list of metals is based partially on experimental evidence and partially on density functional theory using local density approximation and generalized gradient approximation calculations. Metals with atom diameters larger than these listed metals do not appear to have the correct energetics to function according to the method of the present invention.

Figure 6:
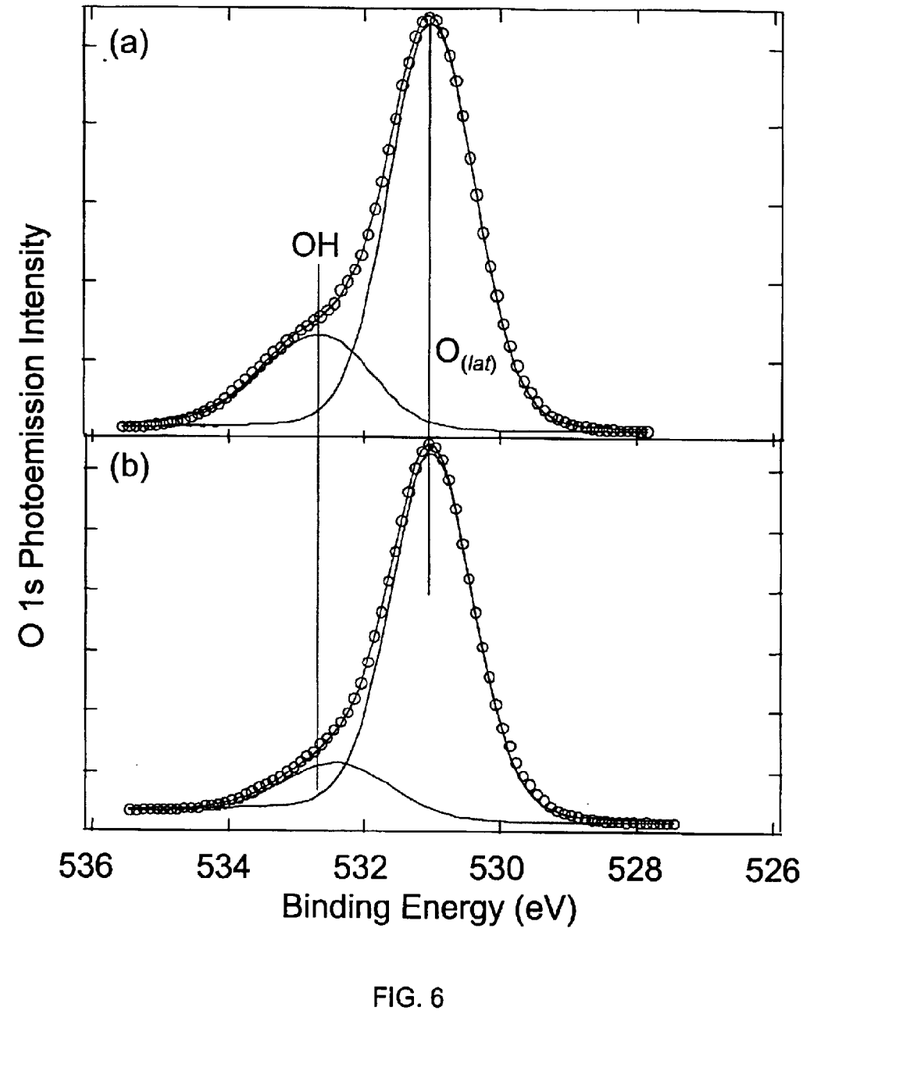
FIG. 6 shows O 1s core-level photoemission data indicating a full ML of hydroxyl on an aluminum oxide surface.
Figure 7:
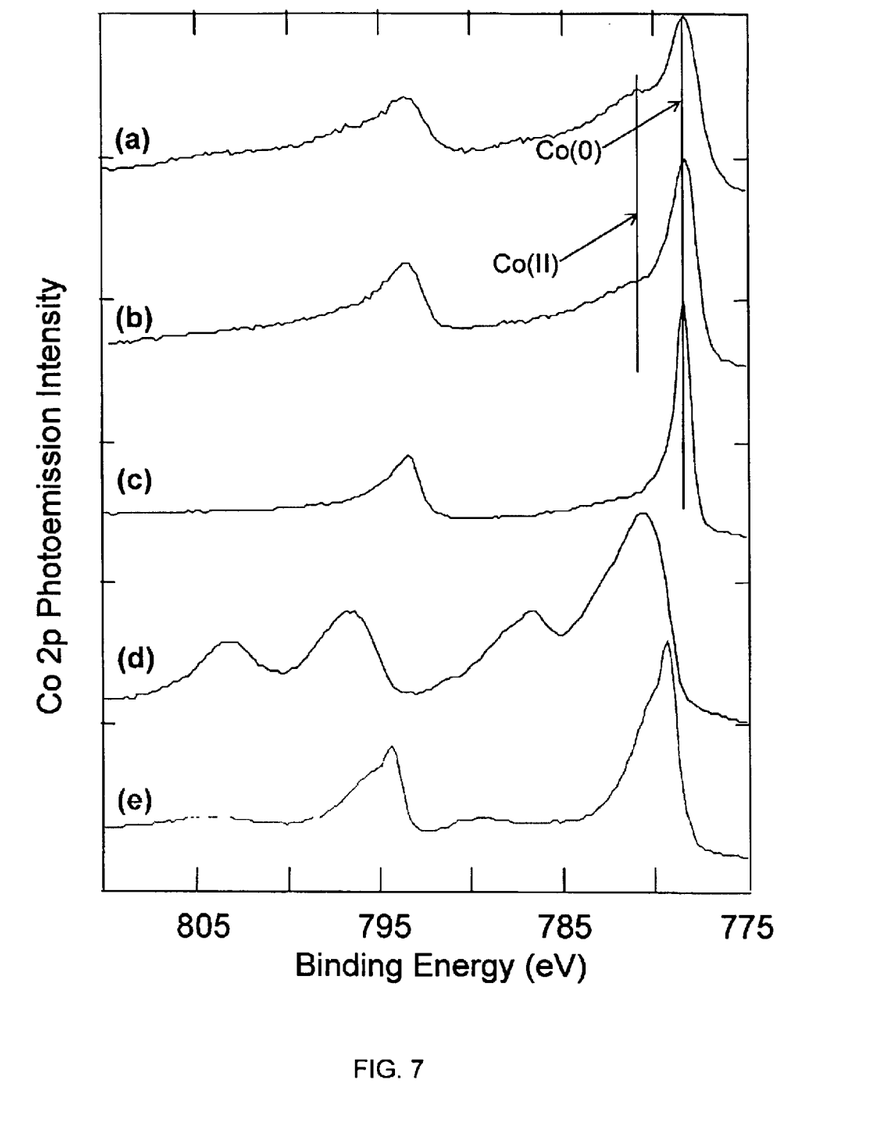
FIG. 7 shows grazing-emission Co 2p spectra showing the presence of both Co(0) and Co(II).

The chemical reaction that takes place at high coverage was determined to be an exothermic reaction where the metal, such as cobalt, reacts with the negatively-charged hydroxyl ions to form the oxidized $Co^{2+}$ and hydrogen gas, with the $Co^{2+}$ serving as the anchoring or binding site. FIG. 6 shows 0 1s core-level photoemission data indicating a full ML of hydroxyl on the aluminum oxide surface. FIG. 7 shows grazing-emission Co 2p spectra following deposition of 0.3 ML (a) and 0.8 ML (b) on aluminum oxide as well as normal-emission spectra for reference surfaces of Co(0001) (c), CoO(001) (d) and $Co_2O_3$(001) (e). Co on aluminum oxide has important applications because of the potential use in nanoscale microelectronic devices, such as magnetoresistive random access memory (MRAM). A thin (approximately 1) aluminum oxide layer is sandwiched between two layers of Co or Co-based alloys to form a tunnel junction using the adhesive capabilities of the method of the present invention.

When clean aluminum oxide is exposed to approximately 1 Torr or more of water, the surface changes to one terminated entirely by OH. The surface is robust, requiring high temperature (up to 1200K) to remove sufficient OH to achieve a ⅓ ML coverage of OH. When using essentially complete OH coverage, high temperature heating is not required however. The metal oxide surface is exposed to hydroxyl ions at low or approximately room temperature, such as in an environment with 1 Torr or more of water, cleaned, and the metal atom or atoms of interest, selected from Cr, Co, Ni, Mo, Ru, Cu and Rh, deposited. The resulting deposition yields a metal strongly adhered to the oxide surface. Full hydroxylation of other oxides can be accomplished using a plasma of oxygen and hydrogen. This can simultaneously clean and hydroxylate the surface.

For example, aluminum oxide was cleaned, such as by sonication in a solvent such as acetone and isopropanol, and then by oxygen plasma cleaning at room temperature in the presence of water vapor, giving a surface essentially free of carbon with trace amounts of bulk impurities such as Mg and Ca. Co depositions were carried at ambient temperature using an effusion cell. Analyses showed that, with the exception of occasional surface defects or dust particles on the surface, there was no appreciable height variation across the film surface, showing that the Co fully covered the hydroxylated aluminum oxide surface with strong adatom-surface interactions (i.e., adhesion).

Figure 3:
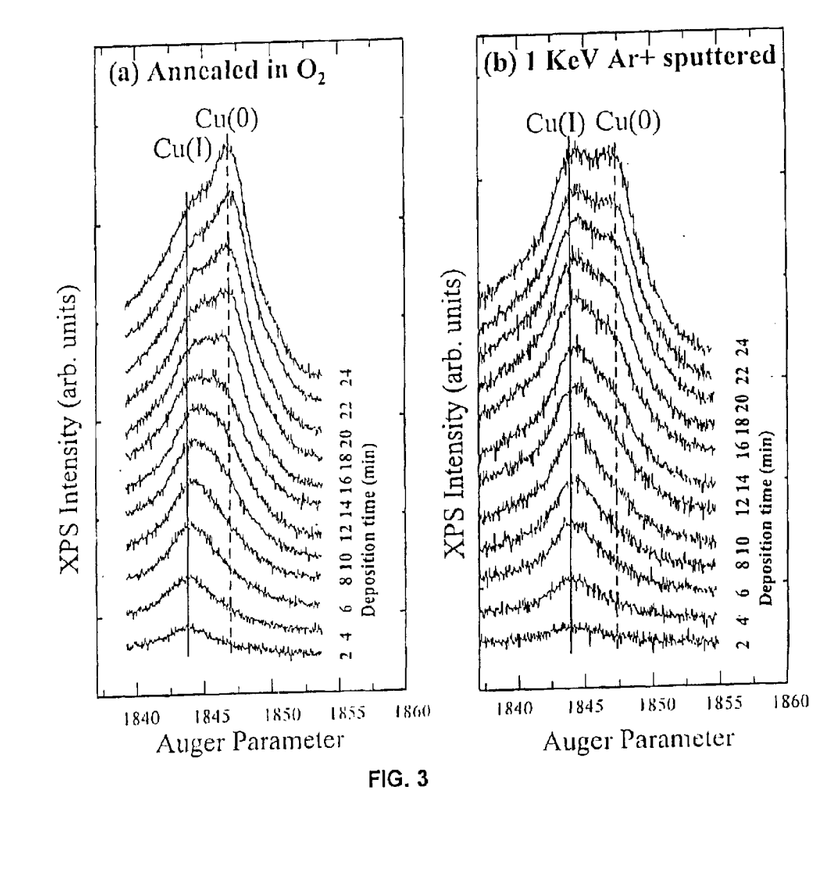
FIG. 3 shows Auger spectroscopy data that demonstrate a hydroxylated alumina surface stabilizing a high (about ⅓ ML) coverage of oxidized Cu atoms.
Figure 4:
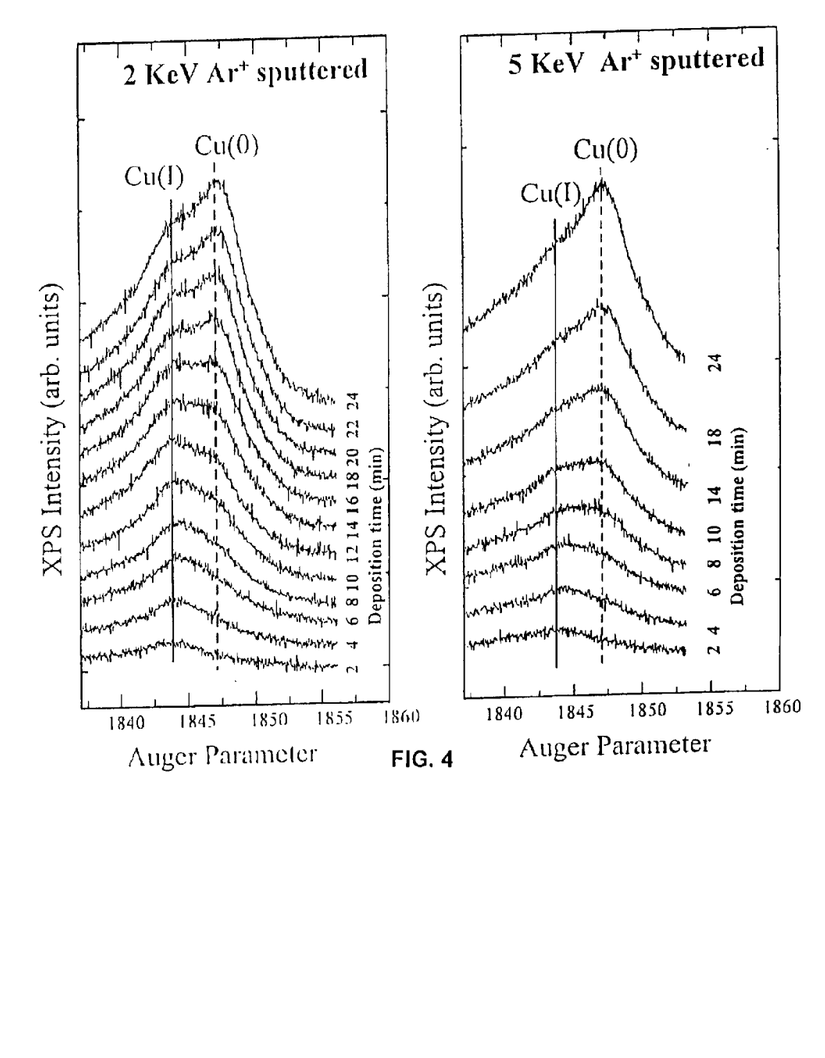
FIG. 4 shows Auger spectroscopy data demonstrating the effect of removal of the hydroxylated species.
Figure 5:
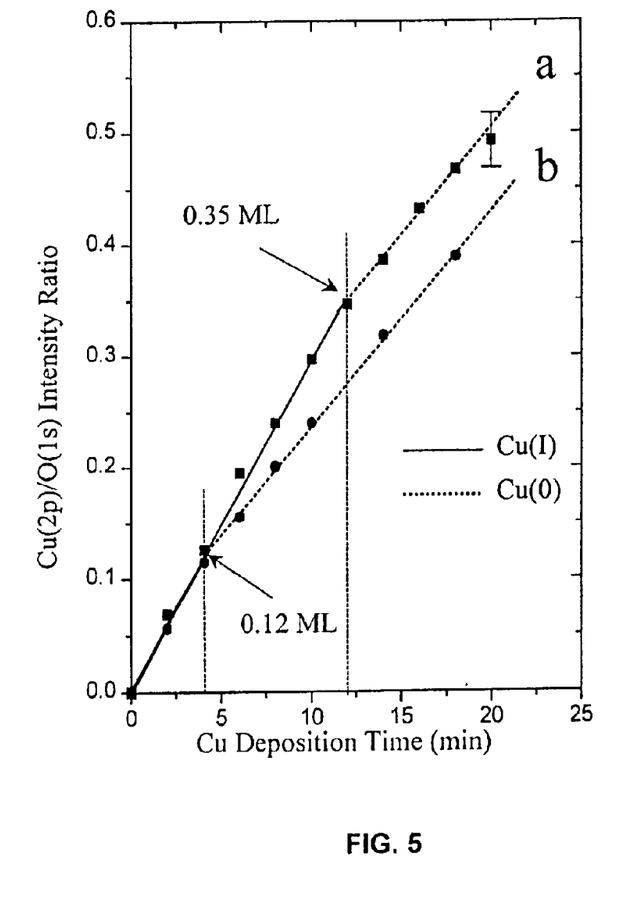
FIG. 5 shows experimental data on the effect of removal of negative ion species on the surface by sputtering.

In another embodiment wherein the negatively-charged species (in this case, hydroxyl ions) is at a lower fractional coverage, copper is wetted onto a cleaned alumina surface. FIG. 3 shows Auger electron spectroscopy data that demonstrates the layer-by-layer growth mode formation of copper on an oxide surface. The oxide surface used in this embodiment was a commonly used alumina surface, sapphire, a corundum modification of aluminum oxide ($Al_2O_3$). Exposure of the basal surface of sapphire to air resulted in a hydroxylated surface which, after cleaning and impurity (such as carbon) removal, was heated to approximately 1200k to achieve approximately ⅓ ML OH coverage, and was then wet by copper in a layer-by-layer growth mode. FIG. 3(a) shows the spread of Cu(I) over the surface according to the method of the present invention. FIG. 3(b) shows the increase in Cu(I) coverage due to carbon removal by 1 KeV Ar+ sputtering compared with FIG. 3(a) without the carbon removal. FIG. 4 shows the effect of continuing sputtering with the right panel showing that, when the negatively-charged species (that is, the hydroxyl ion) has been largely removed by sputtering at 5 KeV, there is a greatly reduced capability to stabilize the first copper layer and layer-by-layer growth does not occur. The experiments have shown that removal of this hydroxylated surface by sputtering with an ion beam in a vacuum chamber causes the surface to permanently lose its ability to be wet by copper. This is also illustrated in FIG. 5, where the lower curve shows the deposition behavior when the negatively-charged species has been sputtered off. Compared with the upper curve, which shows a monolayer coverage on the surface of Cu(I), the lower curve where the hydroxyl ions have been removed shows that monolayer coverage of the surface by copper does not form.

First principles theoretical calculations show the effect is driven by those hydroxyl species which lie atop the oxide surface and that the ultimate increase in the adhesion of metallic copper to the surface, when the hydroxyl density is at saturation coverage, is 2.5 times the binding without the hydroxyl groups. Finally, the calculations show that the presence of copper metal causes dissociation of the hydroxyl groups to be energetically favorable, thus freeing hydrogen gas upon annealing and leaving only an extra oxygen atom at the interface, which still increases the binding by over twice that of an interface without the added negatively charged species.

The experimental data confirm the theoretical predictions. A sapphire sample was first cleaned by sonication in an aqueous solvent, such as acetone, methanol and deionized water prior to insertion into a vacuum system, with working pressures in the analysis chamber of approximately 1–5 $\times 10^{-9}$ Torr and in the range of approximately $10^{-8}$ to $10^{-7}$ Torr in the sputter deposition chamber. Hydroxyl ions were introduced onto the sapphire surface by exposure to ambient air at moderate humidity, and then heated to approximately 1200 k, resulting in a hydroxyl coverage of approximately one-third to one-half monolayer. The humid air can be air with a water content essentially at any value greater than approximately 5% and less than 100% and preferably a humidity value between 20 and 80%, assuming ambient pressure. The humidity should be at a sufficiently high value for approximately a monolayer of water molecules to form. The copper was introduced into the vacuum chamber by magnetron source (other methods could include sputtering a Cu target or simple evaporation) thus depositing Cu onto the surface at room temperature. X-ray photoelectron and Auger electron spectroscopy (XPS and AES, respectively) measurements indicated that layer-by-layer growth (that is, wetting) occurred. The initial fractional Cu adlayer was oxidized to Cu(I) (FIG. 3), in agreement with theoretical predictions. The thermal stability of the deposited Cu layer was tested by annealing the Cu-modified surface to temperatures up to 1000 K in the ultra-high-vacuum system. A 0.35 monolayer coverage of Cu(I) was shown to be stable up to 1000 K, without change in either Cu($2p_{3/2}$) XPS intensity or in oxidation state.

Further Cu deposition produced a metallic second layer bound to the Cu in the first layer (as illustrated in FIGS. 3 and 5). Further annealing converted all Cu on the surface to the metallic form. First principles calculations showed this full ML of Cu was bonded to the surface by an adhesive factor of 2.5 times that of Cu metal on the clean surface.

Experiments were similarly run on a sapphire sample with decreasing amounts of surface hydroxylation. Dehydroxylation was accomplished by argon ion bombardment, followed by annealing in a partial pressure of oxygen to restore surface quality (smoothness) and stoichiometry. Results demonstrated that the degree of hydroxyl surface coverage was critical in the capability of copper to wet sapphire, with the degree of wetting decreasing as the dehydroxylation increased (as illustrated in FIG. 5), thereby confirming theoretical calculations and the effects of using the method of the present invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims. It is also obvious that at higher than normal microelectronic manufacturing pressures, steps will have to be taken to prevent the surface negative species from attracting and binding contaminants from the environment. Such steps may include the simultaneous deposition of the metal with the material containing the negative species.

We claim:

1. A method for adhering a metal to an oxide surface, comprising:
   introducing a negatively-charged species onto an oxide surface; and
   depositing a metal onto said oxide surface.

2. The method of claim 1 wherein the oxide surface is cleaned prior to the introduction of the negatively-charged species to remove impurities.

3. The method of claim 2 wherein the oxide surface is cleaned to remove impurities using a method selected from the group consisting of sonication in a solvent, sputter removal using an ion beam, burning using an oxygen plasma, burning using an ozone source, and annealing in an oxygen ambient.

4. The method of claim 2 wherein said negatively charged species is an hydroxyl ion at a coverage of greater than approximately 0.5 monolayer.

5. The method of claim 4 wherein said coverage of greater than approximately 0.5 monolayer is obtained by a method selected from the group of exposing said cleaned oxide surface to approximately greater than one Torr of water and exposing said cleaned oxide surface to a plasma containing both oxygen and hydrogen.

6. The method of claim 5 wherein said metal is selected from the group consisting of chromium, cobalt, nickel, molybdenum, ruthenium, copper and rhodium.

7. The method of claim 1 wherein the negatively-charged species is introduced by exposure of said oxide surface to atoms so as to produce negatively-charged species onto said oxide surface.

8. The method of claim 1 wherein the negatively-charged species is introduced by exposure of said oxide surface to molecules that dissociate on said oxide surface to produce negatively-charged species.

9. The method of claim 1 wherein the negatively-charged species is introduced by reacting said oxide surface with a compound to produce negatively-charged species on said oxide surface.

10. The method of claim 1 wherein said negatively-charged species are introduced onto said oxide surface by exposing the oxide surface to a material selected from the group consisting of oxygen, water, water plasma, hydroxide-containing compounds, oxygen plasma, oxygen plasma in a hydrogen gas background, and halogens.

11. The method of claim 10 wherein said negatively-charged species is an hydroxyl ion at a coverage of approximately less than one-half monolayer.

12. The method of claim 11 wherein said coverage of approximately less than one-half monolayer is obtained by exposing said oxide surface to achieve approximately one monolayer coverage and heating to approximately 1200 k, thereby reducing said approximately one monolayer coverage to a coverage of approximately less than one-half monolayer.

13. The method of claim 12 wherein said metal is selected from the group consisting of lithium, cobalt, potassium, yttrium, niobium, ruthenium, palladium, platinum, copper, silver, gold and aluminum.

14. The method of claim 1 wherein said oxide surface is a metal oxide.

15. The method of claim 14 wherein said metal oxide surface is an aluminum oxide surface.

16. The method of claim 1 wherein said oxide surface is a non-metal oxide.

17. The method of claim 16 wherein said non-metal oxide is silicon dioxide.

18. The method of claim 1 wherein the oxide surface is annealed in an oxygen environment to reduce the defects in the oxide surface.

19. The method of claim 1 wherein the metal is deposited at a temperature below that which reduces the oxide.

20. The method of claim 1 wherein the metal is deposited at a temperature below that which removes the negatively-charged species on the oxide surface.

21. The method of claim 1 wherein the metal in introduced with the negatively-charged species.

22. The method of claim 1 wherein the metal deposited onto said oxide surface is annealed.

23. A method for adhering copper to an aluminum oxide surface, comprising:

cleaning an aluminum oxide surface;

annealing said aluminum oxide-surface at elevated temperature in an oxygen environment;

introducing a negatively-charged species onto an aluminum oxide surface; and depositing copper onto said aluminum oxide surface.

24. The method of claim 23 wherein the aluminum oxide surface is cleaned by sonication in an aqueous solvent.

25. The method of claim 23 wherein the negatively-charged species is an hydroxyl group.

26. The method of claim 25 wherein the hydroxyl group is introduced by exposure of the aluminum oxide surface to air with a humidity greater than approximately 5%.

27. The method of claim 23 wherein the copper is deposited by a method selected from the group consisting of a sputtering a copper target, evaporation of copper onto said surface, and magnetron copper deposition.

28. The method of claim 27 wherein the copper deposited is stable at 100%.

29. The method of claim 23 wherein the copper deposited onto the aluminum oxide surface has an increased adhesion between said copper and said aluminum oxide surface.

30. The method of claim 23 wherein the copper deposited onto the aluminum oxide results is at a concentration of 0.25 monolayers or greater.

31. A method for adhering a metal selected from the group consisting of Cr, Co, Ni, Mo, Ru, Cu and Rh to an aluminum oxide surface, comprising:

cleaning an aluminum oxide surface;

introducing a hydroxyl ion onto said aluminum oxide surface at room temperature by exposure of said aluminum oxide surface to greater than approximately one Torr of water; and depositing said metal onto said aluminum oxide surface.

* * * * *